United States Patent
Wada (10) Patent No.: US 11,276,572 B2
(45) Date of Patent: Mar. 15, 2022

(54) TECHNIQUE FOR MULTI-PATTERNING SUBSTRATES

(71) Applicant: Tokyo Electron Limited, Tokyo (JP)

(72) Inventor: Toshiharu Wada, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 137 days.

(21) Appl. No.: 16/208,252

(22) Filed: Dec. 3, 2018

(65) Prior Publication Data
US 2019/0181005 A1    Jun. 13, 2019

Related U.S. Application Data

(60) Provisional application No. 62/596,669, filed on Dec. 8, 2017.

(51) Int. Cl.
| | |
|---|---|
| *H01L 21/033* | (2006.01) |
| *H01L 21/027* | (2006.01) |
| *H01L 21/02* | (2006.01) |
| *H01L 21/3213* | (2006.01) |
| *H01L 21/311* | (2006.01) |
| *H01L 21/3105* | (2006.01) |

(52) U.S. Cl.
CPC ...... *H01L 21/0337* (2013.01); *H01L 21/0271* (2013.01); *H01L 21/02252* (2013.01); *H01L 21/02664* (2013.01); *H01L 21/3105* (2013.01); *H01L 21/31138* (2013.01); *H01L 21/32139* (2013.01)

(58) Field of Classification Search
None
See application file for complete search history.

(56) References Cited

U.S. PATENT DOCUMENTS

| | | | | |
|---|---|---|---|---|
| 4,359,487 | A * | 11/1982 | Schneider | H01L 21/288 136/256 |
| 6,270,948 | B1 * | 8/2001 | Sato | G03F 7/094 430/314 |
| 8,110,493 | B1 * | 2/2012 | Subramonium | C23C 16/26 438/618 |
| 9,281,212 | B1 * | 3/2016 | Glodde | H01L 21/31144 |
| 9,368,350 | B1 * | 6/2016 | He | H01L 21/0337 |
| 10,141,183 | B2 * | 11/2018 | Mohanty | H01L 21/02359 |
| 2006/0099802 | A1 * | 5/2006 | Lin | H01L 21/76814 438/637 |
| 2008/0187865 | A1 * | 8/2008 | Ito | C07C 37/055 430/281.1 |

(Continued)

*Primary Examiner* — Allan W. Olsen
(74) *Attorney, Agent, or Firm* — Wood Herron & Evans LLP (57) ABSTRACT

A method for providing etch selectivity in substrate processing is disclosed. More particularly, a plasma treatment is provided to a plurality of exposed structures comprised of varying materials. The plasma treatment will preferentially enhance the etch selectivity between at least two of the exposed structures. In one embodiment, the plurality of exposed structures are utilized as part of a multi-patterning substrate process. In one embodiment, the exposed structures may comprise an organic planarization layer and a spin-on-metal layer. The plasma treatment may comprise a plasma formed using nitrogen and hydrogen gasses and the emission of vacuum ultra-violet (VUV) wavelength radiation from such a plasma.

19 Claims, 6 Drawing Sheets

(56) References Cited

U.S. PATENT DOCUMENTS

| | | | |
|---|---|---|---|
| 2012/0208127 A1* | 8/2012 | Hatakeyama | G03F 7/0048 430/283.1 |
| 2013/0267097 A1* | 10/2013 | Srivastava | H01L 21/0273 438/710 |
| 2014/0151733 A1* | 6/2014 | Koike | G03F 7/0002 257/98 |
| 2014/0159278 A1* | 6/2014 | Yao | C07F 7/28 264/212 |
| 2015/0004801 A1* | 1/2015 | Rahman | G03F 7/09 438/763 |
| 2016/0181090 A1* | 6/2016 | Sanchez | H01L 29/0657 257/618 |
| 2017/0040164 A1* | 2/2017 | Wang | H01L 21/283 |
| 2017/0103949 A1* | 4/2017 | Teng | H01L 21/32131 |
| 2017/0125248 A1* | 5/2017 | Siew | H01L 21/0332 |
| 2017/0154806 A1* | 6/2017 | Wang | H01L 21/02274 |
| 2017/0326558 A1* | 11/2017 | Mahshid | B03C 5/005 |
| 2018/0033622 A1* | 2/2018 | Swaminathan | H01L 21/0337 |
| 2018/0240667 A1* | 8/2018 | Yu | H01L 21/31138 |
| 2018/0351069 A1* | 12/2018 | Boukai | H01L 35/30 |
| 2019/0123035 A1* | 4/2019 | Carothers | H01L 21/30621 |
| 2020/0098629 A1* | 3/2020 | Lin | H01L 21/76885 |
| 2020/0105910 A1* | 4/2020 | Yeong | H01L 29/66545 |

* cited by examiner

FIG. 5

TECHNIQUE FOR MULTI-PATTERNING SUBSTRATES

CROSS-REFERENCE TO RELATED APPLICATIONS

This application is related to and claims priority to U.S. Provisional Patent Application Ser. No. 62/596,669 filed on Dec. 8, 2017, the entire contents of which are herein incorporated by reference.

BACKGROUND

The present disclosure relates to the processing of substrates, such as for example, semiconductor substrates. In particular, it provides a novel method to improve multi-patterning processing of substrates.

As geometries in substrate processing continue to shrink, the technical challenges to forming structures on substrates increase. These challenges are particular found in the in the photolithography and etch process areas. One technique for achieving suitable photolithography for increasingly small critical dimensions involves multi-patterning techniques to provide for pitch splitting. Such multiple patterning techniques have included, for example, self-aligned double patterning, self-aligned triple patterning and self-aligned quadruple patterning. These multi-patterning techniques may involve the utilization of sidewall spacers, fill layers and selective etching for defining structures at pitches that are less than the original photolithography pitch.

For example, in self-aligned double patterning techniques, sidewall spacers are utilized to increase the structure density on the substrate surface. A mandrel structure may be formed on the substrate through known photolithography techniques. Sidewall spacers may then be formed adjacent the mandrel. Removal of the originally patterned mandrel leaves the two sidewall spacers, thus forming two structures for each mandrel. Similarly, self-aligned triple and quadruple patterning techniques are known in which additional sidewall spacers of differing materials may be formed adjacent the first sidewall spacers. Multi-patterning techniques generally include the use of multiple masking steps. The first step may be called the mandrel mask and additional masking step(s) may be called the block mask(s). At various points in the multi-patterning process flow, it is known that various exposed structures (mandrels, first sidewall spacers, second sidewall spacers, planarization layers, spin-on layers, etc.) may be etched selectively to the other exposed structures. The ability to have high etch selectivity among the various materials of the multi-patterning process is an important aspect of implementing a multi-patterning process.

Figure 1A:
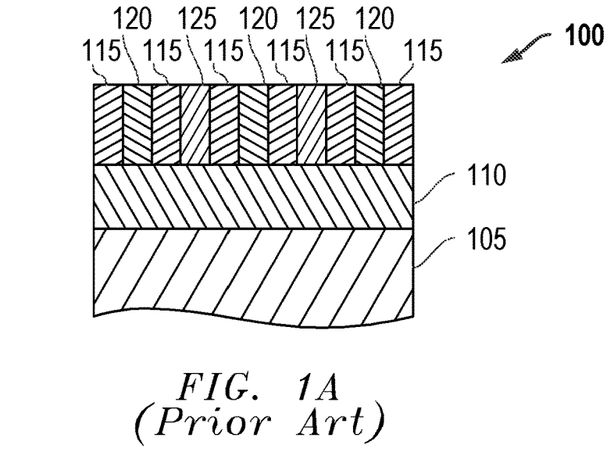
FIGS. 1A-1C illustrates an exemplary prior art structure and process flow utilized during a multi-patterning substrate process
Figure 1B:
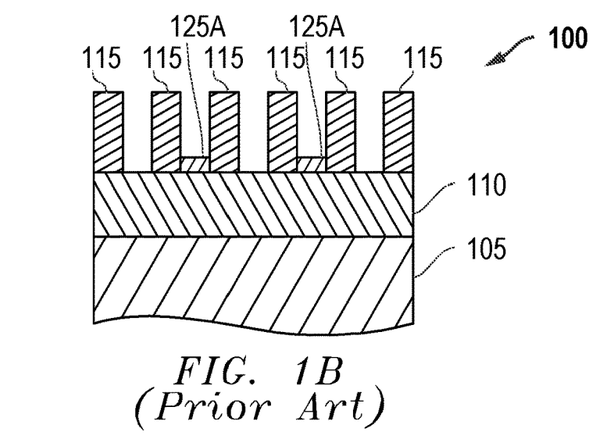
Figure 1C:
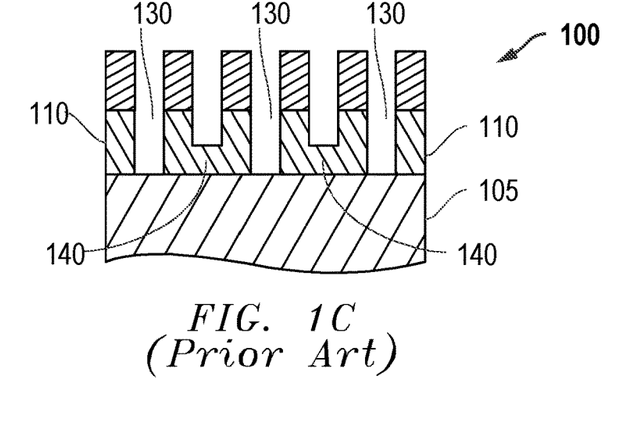

Thus, for example, as shown in FIG. 1A an exemplary structure 100 is illustrated that may be encountered during a multi-patterning process during a substrate processing manufacturing process flow. As shown, a substrate 105 is provided and a hard mask layer 110 is provided. Above the hard mask layer 110, a plurality of multi-patterning process structures are formed. For example, a sidewall spacer 115, an organic planarization layer 120, and a spin-on-metal layer 125 are provided. As will be recognized by those skilled in the art, during the multi-patterning process it may be desirable to etch one of the multi-patterning structures selectively to one or more of the other of the multi-patterning structures. Thus, for example, the multi-patterning process may be one in which it is desirable to etch the organic planarization layer 120 with selectivity to the sidewall spacer 115 and the spin-on-metal layer 125. It has been found, however, that etching the organic planarization layer 120 generally has low selectivity to the etching of the spin-on-metal layer 125. Specifically, though the existence of metal in the spin-on-metal material can increase the selectivity between the organic planarization layer and the spin-on-metal layer, the inclusion of organic substance in the spin-on-metal material will decrease the selectivity. Specifically, the amount of organic substance generally needed to provide good filling and planarization performance for the spin-on-metal layer 125 will result in unsatisfactory etch selectivity. For example, FIG. 1B illustrates an exemplary result which may be seen after etching the organic planarization layer 120. As shown in FIG. 1B, the organic planarization layer 120 has been completely etched, however, a significant portion of the spin-on-metal layer 125 has also been etched as shown by the remaining portions 125A of spin-on-metal layer 125. As a result, when etching of the hard mask layer 110 follows, as shown in FIG. 1C, the hard mask layer 110 is removed in open regions 130 (where the organic planarization layer 120 was removed). However, the significant thinning of the spin-on-metal layer 125 may result in the hard mask layer 110 also being etched as shown in thinned hard mask regions 140. The thinning of the hard mask may be so much that the hard mask is completely removed during the hard mask etch or during subsequent etching of layers underlying the hard mask, resulting in defects such as pattern failure and/or punch-through in the multi-patterning process.

It would be desirable to provide a substrate processing technique which improves the etch selectivity between exposed structures, such as for example, exposed structures of a multi-patterning process.

SUMMARY

Described herein is an innovative method for providing etch selectivity in substrate processing. More particularly, a plasma treatment is provided to a plurality of exposed structures comprised of varying materials. The plasma treatment will preferentially enhance the etch selectivity between at least two of the exposed structures. In one embodiment, the plurality of exposed structures are structures utilized as part of a multi-patterning substrate process. In one embodiment, the exposed structures may comprise an organic planarization layer and a spin-on-metal layer. The plasma treatment may comprise a plasma formed using nitrogen and hydrogen gasses and the emission of vacuum ultra-violet (VUV) wavelength radiation from such a plasma.

In one embodiment, a method for processing of a substrate is provided. The method may comprise providing the substrate, providing a spin-on-metal layer, and providing a second layer, wherein a spin-on-metal layer surface and a second layer surface are both exposed. The method may further comprise treating the spin-on-metal layer surface and the second layer surface with a first plasma process, the treating increasing an etch selectivity between the spin-on-metal layer and the second layer. The method also may comprise plasma etching the second layer with a second plasma process while the spin-on-metal layer is also exposed to the second plasma process, the increased etch selectivity between the spin-on-metal layer and the second layer lessening an amount of the spin-on-metal layer being removed during the second plasma process.

In another embodiment, a method for multi-patterning processing of a substrate is provided. The method may comprise providing the substrate, providing a spin-on-metal layer, and providing an organic planarization layer. The method may further comprise treating the spin-on-metal layer with a first plasma process. The method may further comprising simultaneously exposing both the spin-on-metal layer and the organic planarization layer to a second plasma process, the second plasma process etching the organic planarization layer. The treating of the spin-on-metal layer with the first plasma process improves an etch selectivity between the spin-on-metal layer and the organic planarization layer during the second plasma process, such that less of the spin-on-metal layer is removed during the second plasma process as a result of the first plasma process.

In yet another embodiment, a method for multi-patterning processing of a substrate is provided. The method comprise providing the substrate with a patterned structure, the patterned structure comprising an oxide layer, an organic planarization layer, a spin-on-metal layer, and a hard mask layer. The method may also comprise using a first plasma process to expose at least the oxide layer, the organic planarization layer, and the spin-on-metal layer of the patterned structure to a gas comprising nitrogen and hydrogen and to vacuum ultraviolet radiation, the first plasma process utilized to improve an etch selectivity between the organic planarization layer and the spin-on-metal layer. The method may further comprise performing a plasma etch process for etching the organic planarization layer, wherein the organic planarization layer, the oxide layer, and the spin-on-metal layer are all exposed to the plasma etch process, the plasma etch process for etching the organic planarization layer selectively to the oxide layer and the spin-on-metal layer such that pattern failure and/or punch-through in the does not occur.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

Figure 2A:
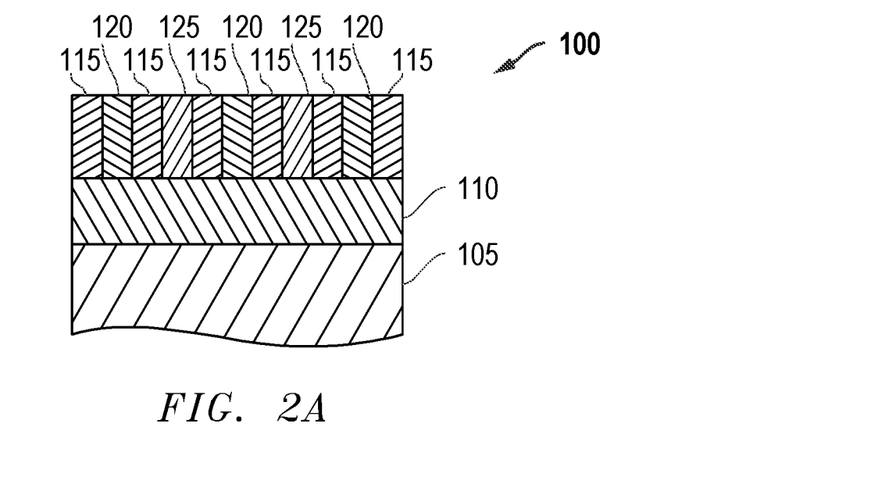
FIGS. 2A-2D illustrate one exemplary process flow utilizing the etch selectivity techniques described herein.

FIGS. 2A-2D provide an exemplary process flow utilizing the etch techniques disclosed herein. The techniques are described in relation to a portion of a multi-patterning process, though it will be recognized that the techniques are not limited to multi-patterning process flows. As shown in FIG. 2A an exemplary structure 100 is illustrated that may be encountered during a multi-patterning process of a substrate processing manufacturing process flow. This exemplary structure conforms to that shown in FIG. 1A. As shown in FIG. 2A, a substrate 105 is provided. Substrate 105 may be any substrate for which the use of patterned features is desirable. For example, in one embodiment, substrate 105 may be a semiconductor substrate having one or more semiconductor processing layers formed thereon. In one embodiment, the substrate 105 may be a substrate that has been subject to multiple semiconductor processing steps which yield a wide variety of structures and layers, all of which are known in the substrate processing art. Hard mask layer 110 is also provided. Hard mask layer 110 may be a silicon layer, silicon nitride layer or a combination thereof. It will be recognized, however, that hard mask layer 110 may be formed of any other of a wide variety of materials known in the art to be suitable for use as a hard mask layer in a patterning process.

Above the hard mask layer 110, a plurality of multi-patterning process structures are formed. For example, a sidewall spacer 115, an organic planarization layer 120, and a spin-on-metal layer 125 are provided. Again it will be recognized that the particular multi-patterning structures shown are merely exemplary, and many other multi-patterning structures and materials may be used while still obtaining the advantages of the techniques described herein. Further, when having the benefit of this disclosure, it will be recognized that the techniques described herein are not limited to the multi-patterning process steps of a substrate process flow. Rather, the layer treatment and etch techniques described may be applied to other process steps, all as would be recognized by those skilled in the art after having the benefit of this disclosure.

In one embodiment, the sidewall spacer 115 may be an oxide sidewall spacer, such as for example, silicon oxide. Other sidewall spacers may be utilized, such as for example, but not limited to, silicon nitride, metal oxide, etc. In one embodiment, the organic planarization layer 120 may be any layer of a wide variety of layers that contains organic material, for example, organic materials and the use of materials such as cyclohexanone, propylene glycol methyl ether (PGME), and propylene gycol monomethyl ether acetate (PGMEA). Other organic planarization materials may be utilized, such as for example, but not limited to chemical vapor deposition carbon, amorphous carbon, etc. The organic planarization layer may be formed in a wide variety of manners, including but not limited to, spin-on techniques, plasma techniques, etc. In one embodiment, the spin-on-metal layer 125 may be titanium metal oxide contained in a solvent, such as for example, cyclohexanone, PGME or PGMEA. Other spin-on-metals may be utilized, such as for example, but not limited to zirconium oxides (ZrOx), tin oxides (SnOx), aluminum oxide (AlOx), etc.

Figure 2B:
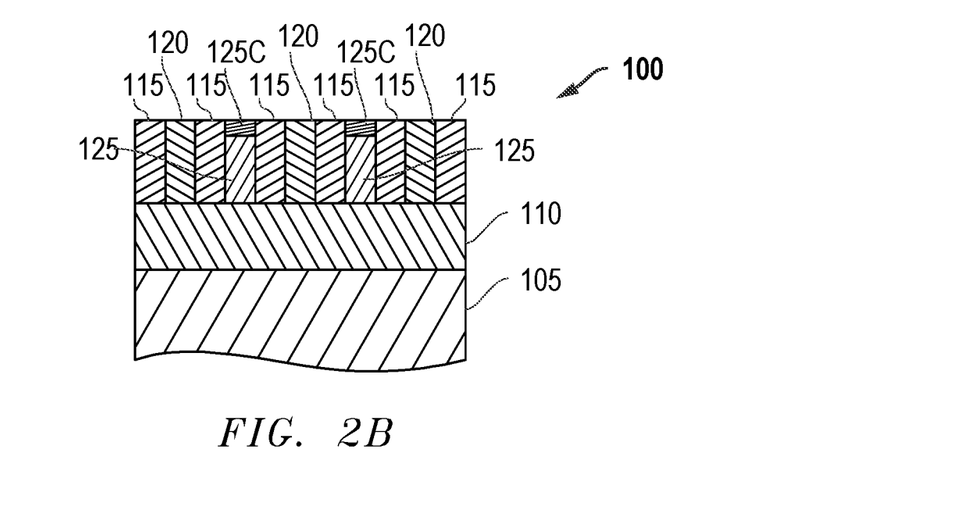
Figure 2C:
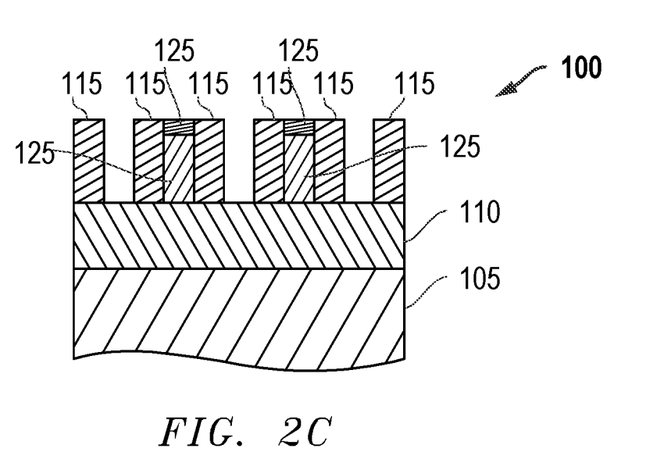
Figure 2D:
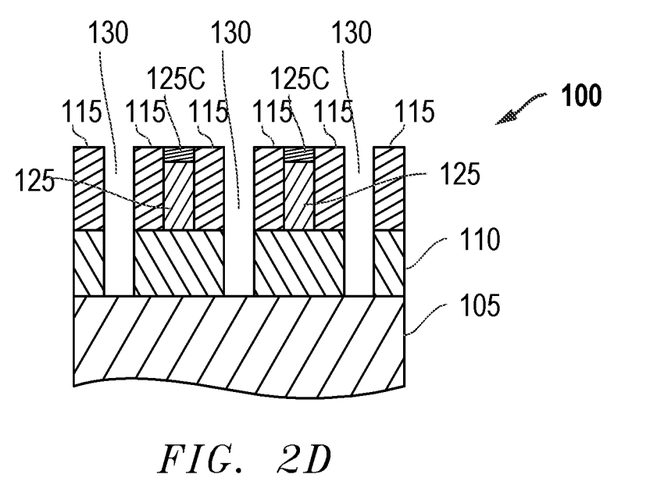

The exemplary structure 100 of FIG. 2A may then be subjected to a plasma process to modify the exposed surface of spin-on-metal layer 125. Specifically, the plasma process may modify a surface of the spin-on-metal layer 125 such that the etch selectivity between the organic planarization layer 120 and the spin-on-metal layer 125 is increased. In this manner, unwanted etching of the spin-on-metal layer 125, such as shown in FIG. 1B (prior art) may be minimized. Thus, as shown in FIG. 2B, an upper layer 125C of the spin-on-metal layer 125 may be created after exposure of the spin-on-metal layer 125 to the plasma process. Then as indicated in FIG. 2C, etching of the organic planarization layer 120 may occur. The improved etch selectivity between the organic planarization layer 120 and the upper layer 125C of the spin-on-metal layer 125 provides for the result shown in FIG. 2C in which the spin-on-metal layer is left substantially unetched. Processing may then proceed to a hard mask etch step as shown in FIG. 2D. As shown in FIG. 2D, the hard mask layer 110 is removed in open regions 130 (where the organic planarization layer 120 was removed). In contrast to the prior art techniques, however, the hard mask layer 110 is still protected in the areas that correspond to the spin-on-metal layer 125. In this manner, the pattern of organic planarization layer 120 is transferred to the hard mask layer 110.

As described, a plasma treatment is provided to a plurality of exposed structures comprised of varying materials. The plasma treatment will preferentially enhance the etch selectivity between at least two of the exposed structures. In one embodiment, the plurality of exposed structures are structures utilized as part of a multi-patterning substrate process. In one embodiment, the exposed structures may comprise an organic planarization layer and a spin-on-metal layer. It will be recognized that the techniques described herein may be advantageously used in a variety substrate processing process steps. Exemplary process steps include multi-patterning process steps. However, the techniques may be utilized in other process steps, as would be recognized by one skilled in the art.

A wide variety of plasma techniques may be utilized to adjust the selectivity of one of the exposed multi-patterning structures with respect to the other structure(s). One such technique is described herein, however, it will be recognized that other techniques may be utilized. For example, exposing the upper surface of the spin-on-metal layer 125 to a plasma process that comprises nitrogen gas and hydrogen gas may be utilized. Moreover, the emission of vacuum ultra-violet wavelength radiation from such a plasma also provides beneficial changes to the spin-on-metal layer 125 such that an upper layer 125C of the spin-on-metal layer 125 may be formed which has an increased resistance to the organic planarization layer etch. In another embodiment, the upper surface of the spin-on-metal layer 125 may be exposed to a plasma process that comprises a plasma comprised of a sulfur containing gas and oxygen gas. For example, the gases may be sulfur dioxide and oxygen. In yet another embodiment, the spin-on-metal layer 125 may by modified through the use of a two-step plasma process: a first step that includes a plasma formed with nitrogen and hydrogen gases and a second step that includes a plasma formed with sulfur dioxide and oxygen gases. For example, in such a process, the spin-on metal material (for example a titanium oxide) may be densified by the nitrogen and hydrogen gas plasma and the emission of vacuum ultra-violet (VUV) wavelength radiation for such a plasma, resulting in an etch resistant upper layer. Further, carbon material of the spin-on-metal may be removed by the nitrogen and hydrogen gas plasma, leaving a surface layer of that is more rich in the metal (for example titanium). Further, a plasma step formed with sulfur dioxide and oxygen gases can provide further selectivity improvement. For example, the use of sulfur dioxide and oxygen gases may adjust the selectivity to the spin-on-metal layer 125 by the deposition of sulfur oxide on the spin-on-metal layer. Other mechanisms may also provide improved selectivity limiting the etching of the spin-on-metal layer 125, as the techniques described herein are not limited to a particular mechanism.

An exemplary plasma process is described in more detail herein, however, other plasma processes may be utilized and the particular variables (power, pressure, gases, etc.) may be varied will still obtaining the benefits of the techniques described herein. One exemplary plasma process that may be utilized has pressure ranges of 10-100 mT, high frequency power ranges of 100-800 W and low frequency power ranges of 50-600 W. A first step of the plasma process may have nitrogen and hydrogen flowing, with the nitrogen flow generally be higher than the hydrogen flow. For example, 300 standard cubic centimeters per minute (SCCM) of nitrogen and 150 SCCM of hydrogen may be utilized. A second step of the plasma process may have sulfur dioxide and oxygen flowing, with the sulfur dioxide flow generally be higher than the oxygen flow. For example, 80 SCCM of sulfur dioxide and 40 SCCM of oxygen may be utilized.

By utilization of an additional plasma surface treatment of the spin-on-metal layer 125, an upper layer 125C of the spin-on-metal layer 125 that may be formed that provides etch resistance to the organic planarization layer etch. In one embodiment, an etch selectivity between an organic planarization layer and a spin-on-metal layer may be approximately 1:1 without the use of the additional plasma surface treatment. An exemplary etch process may be a plasma etch having pressure ranges of 10-100 mT, high frequency power ranges of 100-800 W and low frequency power ranges of 50-600 W. A variety of differing gas combinations and flow rates may be utilized. For example the process gas(es) may be O2 only (100 SCCM), CO2 only (100 SCCM), CO2/Ar (100/300 SCCM), O2/Ar (100/300 SCCM), O2/He (100/300 SCCM), CO2/He (100/300 SCCM), or H2/Ar (200/200 SCCM). With the use of the additional plasma surface treatment, the etch selectivity that may be achieved may be approximately at least 2:1 and more preferably, at least 4:1. Thus, in one embodiment, the organic planarization layer and the spin-on-metal layer may both be approximately between 59 nm and 100 nm thick. For example, with the use of the additional plasma surface treatment, the 50 nm organic planarization layer may be completely removed while leaving approximately at least 25 nm of the spin-on-metal layer and more preferably at least 40 nm of the spin-on-metal layer. In this manner, the hard mask layer in the regions of the spin-on-metal layer may protected during the hard mask layer etch.

Thus, a technique is described which includes treating a spin-on-metal layer surface to a first plasma process. The first plasma process increases the etch selectivity between the spin-on-metal layer and the organic planarization layer during a plasma etch of the organic planarization layer. For example, the first plasma process densifies the upper region of the spin-on-metal layer. In this manner, when the spin-on-metal layer is exposed to the plasma etch of the organic planarization layer, the increased etch selectivity lessens the amount of the spin-on-metal layer being removed. It will be recognized that the techniques described herein are particularly useful during multi-patterning substrate processes as such processes involve the simultaneous exposure of various layers to a plasma etch process, relying on the selectivity of the various layers to the etch to provide the ultimate desired pattern. In one embodiment, treating the spin-on-metal layer includes exposing the spin-on-metal layer to nitrogen and hydrogen gases and vacuum ultraviolet radiation during a plasma process. The improved selectivity to the spin-on-metal layer enables the organic planarization layer and the hard mask layer to be etched in a manner that the hard mask is removed in only the regions of the organic planarization layer, without causing pattern failure or punch-through in the other regions. Thus, a hard mask pattern may be formed in the hard mask layer. In one embodiment, the hard mask pattern in the hard mask layer may have a pitch equal to or less than 10 nm. In this manner, a very small geometry pitch may be created, relying on self-aligned multi-patterning process structures and the ability to etch those structures selectively to each other.

Though generally described herein with regard to a first plasma process for treating a surface of the spin-on-metal and a second plasma process for etching the organic planarization layer, it will be recognized that a single plasma process may be utilized for both the first plasma process and the second plasma process. In such a case, the plasma etch and the first plasma process (the surface treatment plasma process) are done simultaneously. Thus, plasma etching of the organic planarization layer is performed by the first plasma process (the surface treatment process). In this manner a one-step plasma process may be utilized. For example, a plasma formed with nitrogen and hydrogen gases may both treat the surface of the spin-on-metal and etch the organic planarization layer. Likewise, a plasma formed with sulfur dioxide and oxygen gases may both treat the surface of the spin-on-metal and etch the organic planarization layer. Thus, the first and second plasma processes may be combined into one simultaneous process or the first and second plasma processes may be different processes that are performed serially.

Figure 3:
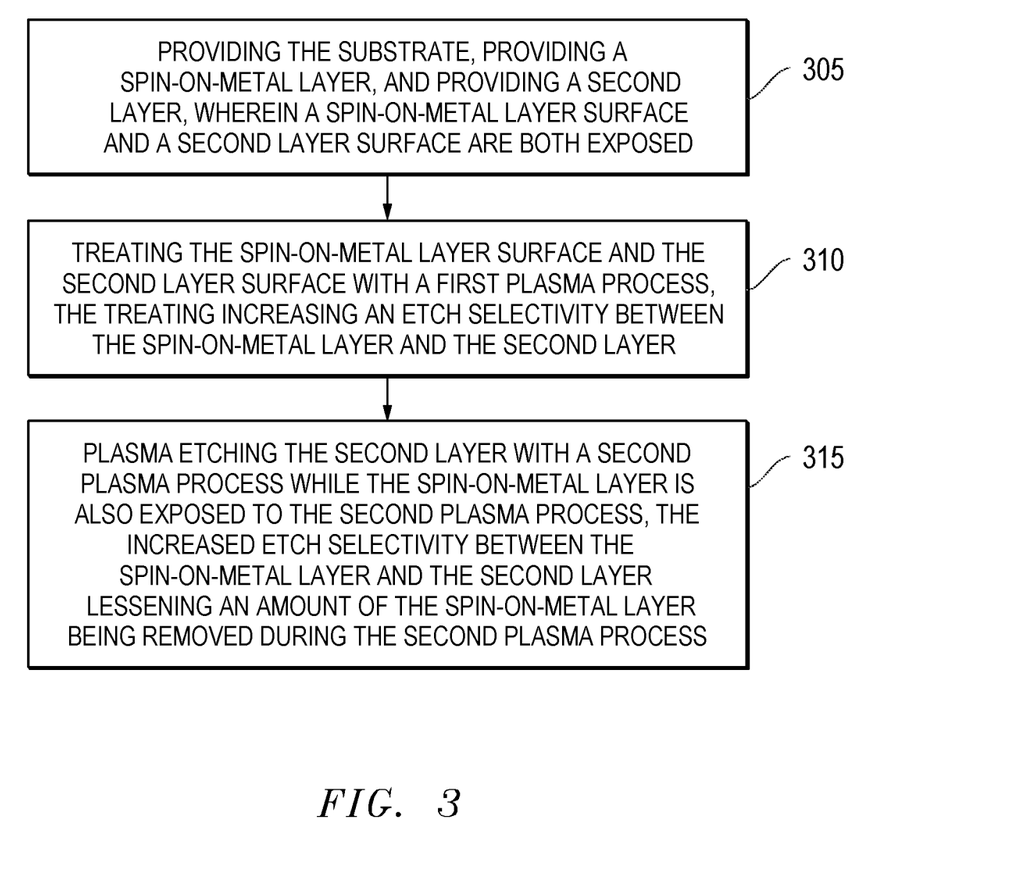
FIGS. 3-5 illustrate exemplary steps for exemplary methods for utilizing the techniques described herein.
Figure 4:
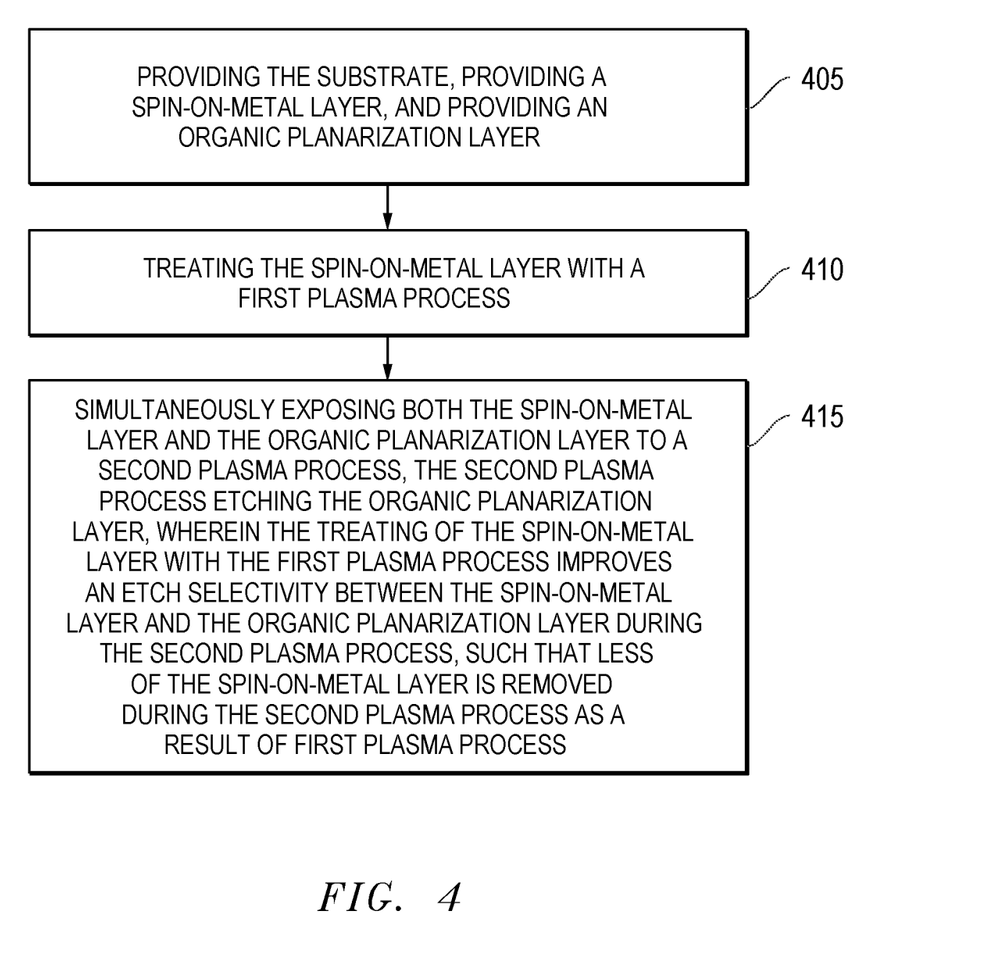
Figure 5:
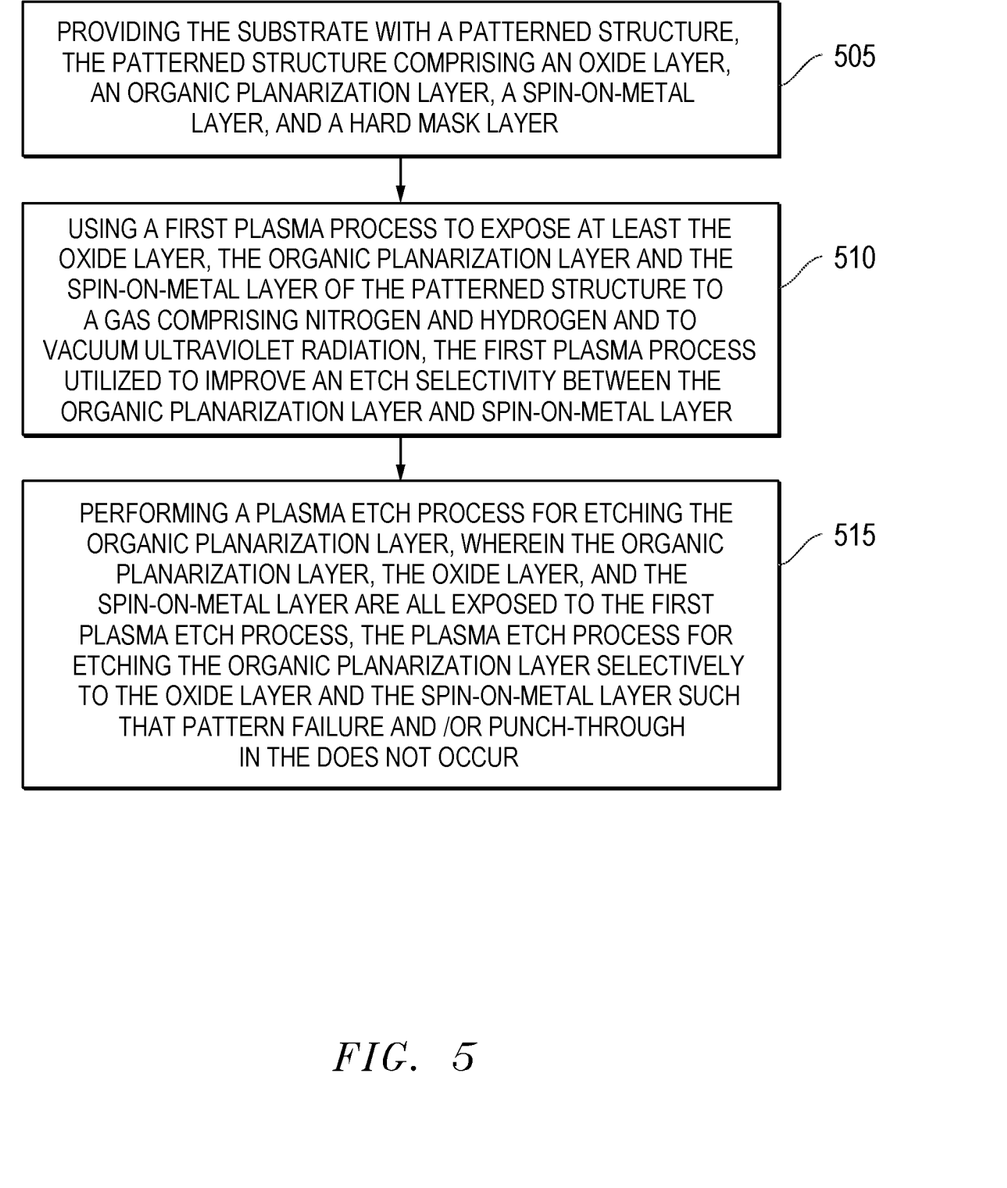

Exemplary process flows for utilizing the techniques described herein are provided in FIGS. 3-5. It will be recognized that these process flows are merely exemplary and the techniques described herein may be utilized in other manners. Further, it will be recognized that additional steps may be added to the exemplary process flows while still utilizing the advantageous benefits of the techniques disclosed herein. Additionally, it will be recognized by those skilled in the art that various steps of the process flows may be performed together or in combination or in a different order and thus, each step of the process flows is not limited to being a separate independent process step as shown.

FIG. 3 illustrates a method for processing a substrate. The process flow of the method may include step 305 for providing the substrate, providing a spin-on-metal layer, and providing a second layer, wherein a spin-on-metal layer surface and a second layer surface are both exposed. The process flow may then proceed to step 310 for treating the spin-on-metal layer surface and the second layer surface with a first plasma process, the treating increasing an etch selectivity between the spin-on-metal layer and the second layer. The process flow may then proceed to step 315 for plasma etching the second layer with a second plasma process while the spin-on-metal layer is also exposed to the second plasma process, the increased etch selectivity between the spin-on-metal layer and the second layer lessening an amount of the spin-on-metal layer being removed during the second plasma process.

FIG. 4 illustrates a method for multi-patterning processing a substrate. The process flow of the method may include step 405 of providing the substrate, providing a spin-on-metal layer, and providing an organic planarization layer. The process flow may then proceed to step 410 of treating the spin-on-metal layer with a first plasma process. The process flow may then proceed to step 415 of simultaneously exposing both the spin-on-metal layer and the organic planarization layer to a second plasma process, the second plasma process etching the organic planarization layer, wherein the treating of the spin-on-metal layer with the first plasma process improves an etch selectivity between the spin-on-metal layer and the organic planarization layer during the second plasma process, such that less of the spin-on-metal layer is removed during the second plasma process as a result of the first plasma process.

FIG. 5 illustrates a method for multi-patterning processing a substrate. The process flow of the method may include step 505 of providing the substrate with a patterned structure, the patterned structure comprising an oxide layer, an organic planarization layer, a spin-on-metal layer, and a hard mask layer. The process flow may then proceed to step 510 of using a first plasma process to expose at least the oxide layer, the organic planarization layer, and the spin-on-metal layer of the patterned structure to a gas comprising nitrogen and hydrogen and to vacuum ultraviolet radiation, the first plasma process utilized to improve an etch selectivity between the organic planarization layer and the spin-on-metal layer. The process flow may then proceed to step 515 of performing a plasma etch process for etching the organic planarization layer, wherein the organic planarization layer, the oxide layer, and the spin-on-metal layer are all exposed to the first plasma etch process, the plasma etch process for etching the organic planarization layer selectively to the oxide layer and the spin-on-metal layer such that pattern failure and/or punch-through in the does not occur.

Though the exemplary process flows of FIGS. 3-5 are described with regards to a first plasma process utilized for treating the spin-on-metal layer surface and a second plasma process for etching the organic planarization layer, it will be recognized that the first plasma process and the second plasma process may be a single combined plasma process as described above. In such a case, the single plasma process may both treat the spin-on-metal layer surface and etch the organic planarization layer.

Although the concepts disclosed herein have been described within the exemplary embodiment of a multi-patterning process, it will be recognized that the techniques may be utilized at other stages of substrate processing. Thus, at any stage in which an etch selectivity to a spin-on-metal layer is desired to be improved, the additional plasma surface treatment described herein may be utilized. In this manner, it will be recognized by those skilled in the art (after having the benefit of the disclosure provided herein) that the techniques described may be utilized in a variety of manners during substrate processing.

It will be recognized that the layers, and the materials that comprise the layers, that are described herein are merely exemplary. However, other materials may be utilized and the concepts described herein may be implemented without even using such layers. Further, it will be recognized that the various process layers and structures shown may be utilized with additional intervening process layers and coatings as would be understood by those in the art. Thus, for example, more or less materials may be utilized between the multi-patterning structures and hard mask layer 110, additional layers or coatings may be utilized between the hard mask layer 110 and the substrate 105, etc. Thus, it will be recognized that the use of a plasma surface treatment to improve etch selectivity to a multi-patterning structure may be accomplished in a wide variety of ways.

Further modifications and alternative embodiments of the inventions will be apparent to those skilled in the art in view of this description. Accordingly, this description is to be construed as illustrative only and is for the purpose of teaching those skilled in the art the manner of carrying out the inventions. It is to be understood that the forms and method of the inventions herein shown and described are to be taken as presently preferred embodiments. Equivalent techniques may be substituted for those illustrated and describe herein and certain features of the inventions may be utilized independently of the use of other features, all as would be apparent to one skilled in the art after having the benefit of this description of the inventions.

What is claimed is:
1. A method for processing of a substrate, the method comprising:
  providing the substrate;
  providing a spin-on-metal-oxide layer;

providing a second layer, wherein a spin-on-metal-oxide layer surface and a second layer surface are both exposed;

treating the spin-on-metal-oxide layer surface and the second layer surface with a first plasma process, wherein the spin-on-metal-oxide layer surface and the second layer surface are both directly exposed to the first plasma process, the treating increasing an etch selectivity between the spin-on-metal-oxide layer and the second layer, and wherein the first plasma process includes the use of a sulfur containing gas; and plasma etching the second layer while the spin-on-metal-oxide layer is also exposed, the increased etch selectivity between the spin-on-metal-oxide layer and the second layer lessening an amount of the spin-on-metal-oxide layer being removed during the plasma etching of the second layer.

2. The method of claim 1, wherein the first plasma process includes the use of a nitrogen gas and a hydrogen gas.

3. The method of claim 2, wherein the second layer contains organic material.

4. The method of claim 3, wherein a pattern of the second layer is transferred to a hard mask layer underlying the second layer.

5. The method of claim 4, further comprising a sidewall spacer, a surface of the sidewall spacer being exposed to the first plasma process.

6. The method of claim 1, wherein the plasma etching the second layer is performed with a second plasma process, the first plasma process and the second plasma process being performed serially.

7. A method for multi-patterning processing of a substrate, the method comprising:
providing the substrate;
providing a spin-on-metal-oxide layer;
providing an organic planarization layer;
treating the spin-on-metal-oxide layer with a first plasma process wherein the spin-on-metal-oxide layer and the organic planarization layer are both directly exposed to the first plasma process, and wherein the first plasma process includes the use of a sulfur containing gas; and
simultaneously exposing both the spin-on-metal-oxide layer and the organic planarization layer to a plasma etch, the plasma etch etching the organic planarization layer,
wherein the treating of the spin-on-metal-oxide layer with the first plasma process improves an etch selectivity between the spin-on-metal-oxide layer and the organic planarization layer during a second plasma process, such that less of the spin-on-metal-oxide layer is removed during the second plasma process as a result of the first plasma process.

8. The method of claim 7, wherein the plasma etch and the first plasma process are performed serially.

9. The method of claim 8, wherein the first plasma process includes the use of a nitrogen gas and a hydrogen gas.

10. The method of claim 8, further comprising providing a sidewall spacer, wherein the sidewall spacer, the spin-on-metal-oxide layer and the organic planarization layer are all simultaneously exposed to the plasma etch.

11. The method of claim 10, wherein a pattern of the organic planarization layer is transferred to a hard mask layer, the hard mask layer underlying the sidewall spacer, the spin-on-metal-oxide layer and the organic planarization layer.

12. The method of claim 7, wherein the first plasma process is a two-step plasma process, a first step comprising use of the nitrogen gas and the hydrogen gas and a second step comprising the use of the sulfur containing gas.

13. The method of claim 12, wherein the second step comprising the use of a sulfur dioxide gas and an oxygen gas.

14. The method of claim 7, wherein the first plasma process densifies at least a surface of the spin-on-metal-oxide layer.

15. A method for multi-patterning processing of a substrate, the method comprising:
providing the substrate with a patterned structure, the patterned structure comprising an oxide layer, an organic planarization layer, a spin-on-metal-oxide layer, and a hard mask layer;
using a first plasma process to expose at least the oxide layer, the organic planarization layer, and the spin-on-metal-oxide layer of the patterned structure to a gas comprising nitrogen and hydrogen and to vacuum ultraviolet radiation, the first plasma process utilized to improve an etch selectivity between the organic planarization layer and the spin-on-metal-oxide layer, and wherein the first plasma process includes the use of a sulfur containing gas; and
performing a plasma etch process for etching the organic planarization layer, wherein the organic planarization layer, the oxide layer, and the spin-on-metal-oxide layer are all exposed to the plasma etch process, the plasma etch process for etching the organic planarization layer selectively to the oxide layer and the spin-on-metal-oxide layer such that pattern failure and/or punch-through does not occur.

16. The method of claim 15, further comprising forming a hard mask pattern in the hard mask layer, the hard mask pattern having a pitch equal to or less than 10 nm.

17. The method of claim 15, wherein the first plasma process is a two-step plasma process, a first step comprising the use the gas comprising nitrogen and hydrogen and a second step comprising the use of the sulfur containing gas.

18. The method of claim 17, wherein the second step comprising the use of a sulfur dioxide gas and an oxygen gas.

19. The method of claim 15, wherein the first plasma process densifies at least a surface of the spin-on-metal-oxide layer.

* * * * *

UNITED STATES PATENT AND TRADEMARK OFFICE
CERTIFICATE OF CORRECTION

PATENT NO. : 11,276,572 B2
APPLICATION NO. : 16/208252
DATED : March 15, 2022
INVENTOR(S) : Toshiharu Wada Page 1 of 2

It is certified that error appears in the above-identified patent and that said Letters Patent is hereby corrected as shown below:

In the Drawings

Fig. 5, box 515, last line, "IN THE DOES NOT OCCUR" should read --- DOES NOT OCCUR ---.

In the Specification

In Column 1, Lines 10-11, "substrates, such as for example," should read --- substrates such as, for example, ---.

In Column 1, Lines 20-21, "challenges are particular found in the in the" should read --- challenges are particularly found in the ---.

In Column 3, Lines 12-13, "The method comprise" should read --- The method comprises ---.

In Column 3, Lines 29-30, "punch -through in the does not occur" should read --- punch-through does not occur ---.

In Column 3, Line 43, "FIGS. 1A-1 C illustrates" should read --- FIGS. 1A-1C illustrate ---.

In Column 4, Line 27, "sidewall spacer, such as for example," should read --- sidewall spacer such as, for example ---.

In Column 4, Lines 28-29, "may be utilized, such as for example" should read --- may be utilized such as, for example ---.

In Column 4, Lines 36-37, "may be utilized, such as for example" should read --- may be utilized such as, for example ---.

In Column 4, Line 39, "manners, including" should read --- manners including, ---.

Signed and Sealed this
Twenty-seventh Day of September, 2022

Katherine Kelly Vidal
*Director of the United States Patent and Trademark Office*

CERTIFICATE OF CORRECTION (continued)
U.S. Pat. No. 11,276,572 B2

In Column 4, Line 42, "in a solvent, such as for example" should read --- in a solvent such as, for example ---.

In Column 4, Lines 43-44, "may be utilized, such as for example" should read --- may be utilized such as, for example ---.

In Column 5, Line 46, "surface layer of that" should read --- surface layer that ---.

In Column 5, Lines 58-59, "may be varied will still" should read --- may be varied while still ---.

In Column 5, Lines 64-65, "generally be higher" should read --- generally being higher ---.

In Column 6, Lines 7-8, "metal layer 125 that may be" should read --- metal layer 125 may be ---.

In Column 6, Line 32, "layer may protected" should read --- layer may be protected ---.

In Column 6, Lines 47, "various layers to the etch" should read --- various layers of the etch ---.

In Column 8, Line 13, "punch-through in the does" should read --- punch-through does ---.

In the Claims

In Column 10, Line 48, Claim 17, "the use the gas" should read --- the use of gas ---.